United States Patent
Kim et al.

(10) Patent No.: US 7,939,436 B2
(45) Date of Patent: May 10, 2011

(54) METHOD OF FABRICATING A SEMICONDUCTOR DEVICE

(75) Inventors: Sung-Min Kim, Incheon (KR); Min-Sang Kim, Seoul (KR); Keun-Hwi Cho, Seoul (KR); Ji-Myoung Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/353,398

(22) Filed: Jan. 14, 2009

(65) Prior Publication Data

US 2009/0197383 A1    Aug. 6, 2009

(30) Foreign Application Priority Data

Jan. 14, 2008   (KR) .................. 10-2008-0003960

(51) Int. Cl.
*H01L 21/20*   (2006.01)
*H01L 21/36*   (2006.01)
(52) U.S. Cl. . 438/508; 438/706; 438/745; 257/E21.023; 257/E21.228; 257/E21.229; 257/E21.236; 257/E21.24; 257/E21.246; 257/E21.247; 257/E21.252; 257/E21.257; 257/E21.258; 257/E21.278; 257/E21.293; 257/E21.435; 257/E21.646
(58) Field of Classification Search .................. 438/508, 438/510, 197, 238, 381, 706, 723, 724, 736, 438/745; 257/E21.023, 228, 229, 236, 246, 247, 252, 257, 258, 278, 293, 435, 646
See application file for complete search history.

(56) References Cited

U.S. PATENT DOCUMENTS

| 5,516,711 | A  | * | 5/1996  | Wang ............................. 438/197 |
| 5,789,298 | A  | * | 8/1998  | Gardner et al. ................ 438/286 |
| 6,346,732 | B1 | * | 2/2002  | Mizushima et al. .......... 257/382 |
| 7,045,429 | B2 |   | 5/2006  | Liu et al. |
| 7,135,374 | B2 |   | 11/2006 | Koh |

FOREIGN PATENT DOCUMENTS

| KR | 1020040092777 A | 11/2004 |
| KR | 1020050007697 A | 1/2005 |
| KR | 1020050079292 A | 8/2005 |

* cited by examiner

*Primary Examiner* — David Nhu
(74) *Attorney, Agent, or Firm* — Volentine & Whitt, PLLC

(57) ABSTRACT

A method of fabricating a semiconductor device forms a micro-sized gate, and mitigates short channel effects. The method includes a pull-back process to form the gate on a substrate. The method also includes forming inner and outer spacers on the gate that are asymmetric to one another with respect to the gate, and using the spacers in forming junction regions in the substrate on opposite sides of the gate. In particular, the inner and outer spacers are formed on opposite sides of the gate so as to have different thicknesses at the bottom of the gate. The inner and outer junction regions are formed by doping the substrate before and after the spacers are formed. Thus, the inner and outer junction regions have extension regions under the inner and outer spacers, respectively, and the extension regions have different lengths.

20 Claims, 7 Drawing Sheets

METHOD OF FABRICATING A SEMICONDUCTOR DEVICE

BACKGROUND OF THE INVENTION

1. Field of the Invention

The present invention relates to a method of fabricating a semiconductor device. More particularly, the present invention relates to a method of fabricating a micro-sized gate of a transistor.

2. Description of the Related Art

The gates of transistors of semiconductor devices are gradually becoming smaller as semiconductor devices in general become more highly integrated. As a result, the significance of the affect of the electric field of a junction region on electric potential in a channel region of a transistor may increase. For example, the scaling down of a transistor may give rise to short channel effects such as the lowering of the threshold voltage of the transistor and/or punch through. The performance/quality of a semiconductor device may be undermined by such short channel effects.

SUMMARY OF THE INVENTION

An object of the present invention is to provide a method of fabricating a micro-sized gate of a semiconductor device.

Another object of the present invention is to provide a method of fabricating a semiconductor device which is improved with respect to short channel effects.

According to one aspect of the present invention, there is provided a method of fabricating a semiconductor device which includes forming a gate on a substrate, and forming asymmetric junction regions in the substrate on opposite sides of the gate. To this end, a spacer is formed over the upper surface and sidewalls of the gate, and the spacer is formed so as to be asymmetric with respect to a plane that extends perpendicular to the substrate intermediate opposite sidewalls of the gate.

The spacer is formed of a first spacer element, and a second spacer element. The first spacer element is formed over the upper surface and one sidewall of the gate, and the second spacer element is formed over the other sidewall of the gate. Also, the first and second spacer elements are formed so as to have different thicknesses in a widthwise direction of the gate as measured at the bottom of the gate adjacent the substrate.

The first junction region is formed by doping the substrate before the first spacer element is formed to thereby form a first impurity extension region in the substrate, and by doping the substrate after the first spacer element has been formed to thereby form a first impurity region in the substrate laterally adjacent to the first spacer element. In this respect, the substrate is preferably doped at a higher concentration when forming the first impurity region than when forming the first impurity extension region. Similarly, the second junction region is formed by doping the substrate with an impurity before the second spacer element is formed to thereby form a second impurity extension region in the substrate, and by doping the substrate after the second spacer element has been formed to thereby form a second impurity region in the substrate laterally adjacent to the second spacer element. The substrate is preferably doped at a higher concentration when forming the second impurity region than when forming the second impurity extension region. Thus, the first impurity extension region and the second impurity extension region have respective lengths corresponding to the thicknesses of the first and second spacer elements, respectively. That is the second impurity extension region has a different length than the first impurity extension region.

According to another aspect of the present invention, there is provided a method of fabricating a semiconductor device which includes forming a pair of gates on a substrate, and forming asymmetric junction regions in the substrate on opposite sides of each gate. The asymmetric junction regions include an inner junction region located between the pair of gates, and outer junction regions laterally outwardly of the pair of gates. Each of the outer junction regions is asymmetric to the inner junction region with respect to a plane that extends perpendicular to the substrate intermediate the sidewalls of the gate which lies between the outer and inner junction regions. The forming of the inner and outer junction regions is facilitated by forming outer spacers on outer sidewalls of the gates, respectively, and forming inner spacers on inner sidewalls of the gates, respectively, such that the inner and outer spacers formed on each gate are asymmetrical to one another with respect to a plane that extends perpendicular to the substrate intermediate the sidewalls of the gate.

The inner junction region may be formed by forming an inner source/drain region in the substrate between the pair of gates by doping the substrate with an impurity, and forming inner source/drain extension regions in the substrate below the inner spacers and adjacent opposite ends of the inner source/drain region, respectively. Preferably, the inner source/drain extension regions are formed by doping the substrate with an impurity at a concentration lower than that used to form the inner source/drain region. Similarly, the outer junction regions are formed by forming outer source/drain regions in the substrate laterally outwardly of the pair of gates by doping the substrate with an impurity, and forming outer source/drain extension regions in the substrate below the outer spacers and adjacent ends of the outer source/drain regions, respectively. Preferably, the outer source/drain extension regions are formed by doping the substrate with an impurity at a concentration lower than that used to form the outer source/drain regions.

Also, the inner and outer spacers are formed on each of the gates so as to have different thicknesses in a widthwise direction of the gate as measured at the bottom of the gate adjacent the substrate. Therefore, the inner source/drain extension regions have lengths corresponding to the thicknesses of the inner spacers, respectively, and the outer source/drain extension regions have lengths corresponding to the thicknesses of the outer spacers, respectively. Accordingly, the length of each of the inner source/drain extension regions is different from the length of the outer source/drain extension region disposed across the gate therefrom. Preferably, the length of each of the outer source/drain extension regions is greater than the length of the inner source/drain extension region disposed across the gate therefrom.

According to yet another aspect of the present invention, there is provided a method of fabricating a semiconductor device which includes forming micro-sized gates through a step of reducing the size of a gate mask on a conductive pattern. The resulting gate mask pattern extends over an intermediate part of the conductive pattern and exposes the upper surface of the conductive pattern at opposite sides of the conductive pattern. Then outer spacers are formed over a respective sidewall and an exposed portion of the upper surface of the conductive pattern as well as over a respective sidewall of the gate mask pattern. Subsequently, the gate mask pattern is removed to expose the intermediate portion of the conductive pattern. Also, the exposed portion of the conductive pattern is etched away to thereby form a pair of gates from the conductive pattern. The method also includes doping the substrate at appropriate times to form an inner junction region in the substrate between the pair of gates, and outer junction regions located in the substrate on opposite sides of a region of the substrate over which the conductive pattern is formed. Thus, in the final product the outer junction regions are located in the substrate laterally outwardly of the pair of gates.

Preferably, the gate mask pattern is formed by a pull-back process. In this process, a conductive layer is formed on the substrate, and a gate mask is formed on the conductive layer. Then, the conductive layer is etched using the gate mask as an etching mask to form the conductive pattern. Subsequently, the gate mask is "pulled-back" from the opposite sides of the conductive pattern by etching the gate mask.

The outer spacers may be formed by depositing on the substrate insulating material having an etch selectivity with respect to the material of the gate mask, and etching the resulting layer of insulating material.

The method may further include forming a first insulation layer on the substrate after the outer junction regions have been formed. The first insulation layer is formed such that the gate mask pattern is left exposed. A second insulation layer may be formed on the substrate between the inner spacers after the inner junction region has been formed.

BRIEF DESCRIPTION OF THE DRAWINGS

These and other objects, features and advantages of the present invention will become more apparent from the following detailed description of the preferred embodiments thereof made with reference to the accompanying drawings. In the drawings.

Note, like reference numerals are used to designate like elements throughout the drawings.

DETAILED DESCRIPTION OF THE PREFERRED EMBODIMENTS

Figure 1:
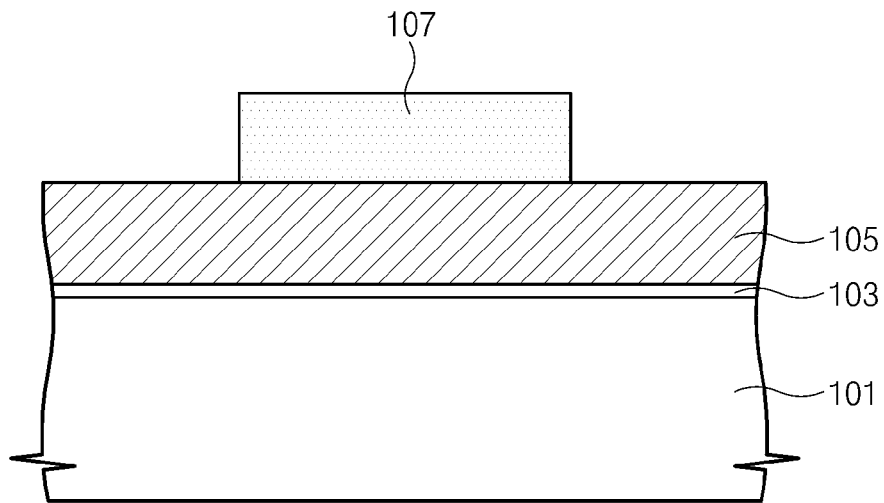
FIGS. 1 through 13 are each a cross-sectional view of a substrate and together illustrate a method of fabricating a semiconductor device according to the present invention.

A method of forming a gate of a semiconductor device according to the present invention will now be described with reference to the figures. Referring first to FIG. 1, an oxide layer 103 is formed on a substrate 101. For example, the substrate 101 is a semiconductor substrate such as a silicon wafer, and the oxide layer 103 is a silicon oxide layer. Also, an active region is defined in the substrate 101 by a device isolation layer (not shown).

Next, a conductive layer 105 is formed on the oxide layer 103, and a gate mask 107 is formed on the conductive layer 105. The conductive layer 105 may be formed by depositing polysilicon on the oxide layer 103, and the gate mask 107 may be formed by depositing silicon nitride on the conductive layer and patterning the resulting layer of silicon nitride.

Figure 2:
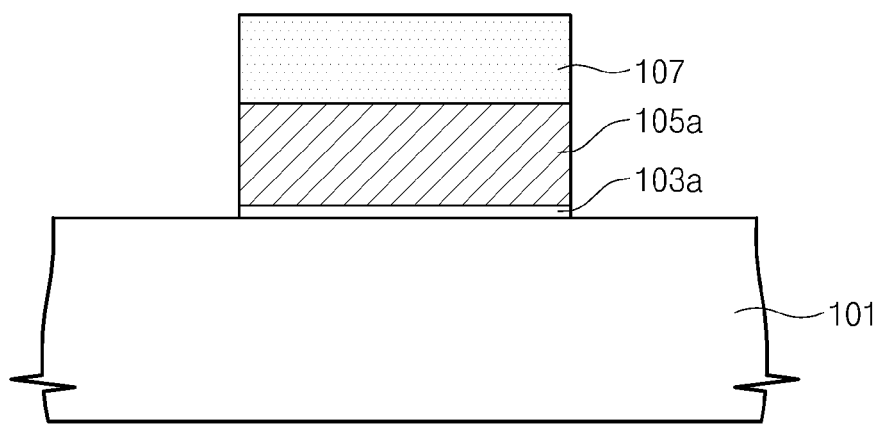

Referring to FIG. 2, the conductive layer 105 and the oxide layer 103 may be simultaneously etched, by a dry etch process that employs the gate mask 107 as an etch mask, to form a conductive layer pattern 105a and an oxide layer pattern 103a. Alternatively, the conductive layer 105 is selectively etched by a first dry etch process that employs the gate mask 107 as an etch mask to form the conductive layer pattern 105a. Subsequently, the oxide layer 103 is selectively etched by a second dry etch process that has a process recipe different from that of the first dry etch process. The second dry etch process employs the gate mask 107 and the conductive layer pattern 105a as an etch mask. Consequently, the oxide layer pattern 103a is formed below the conductive layer pattern 105a.

Figure 3:
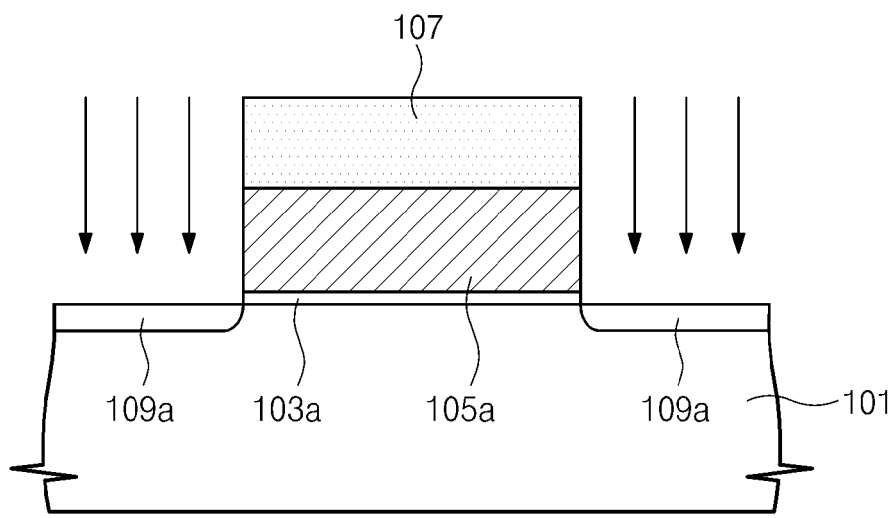

Referring to FIG. 3, a pair of outer source/drain extension regions 109a is formed in the substrate 101 adjacent to the sides of the conductive layer pattern 105a by doping the substrate 101 with an impurity.

Figure 4:
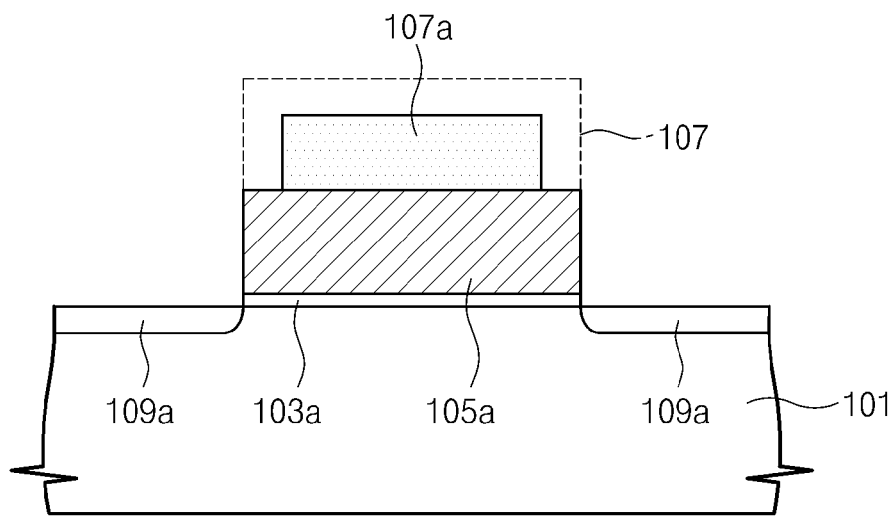

Referring to FIG. 4, a pullback process is performed on the gate mask 107 to form a reduced gate mask pattern 107a. Part of the upper surface of the conductive layer pattern 105a is exposed by the reduced gate mask pattern 107a. The pullback process may be a wet etch process in which the gate mask 107 is isotropically etched (blanket-etched without using an etch mask). For example, the gate mask 107 may be wet etched using $H_3PO_4$ when the gate mask 107 is of silicon nitride. Alternatively, the pullback process may be a dry etch process in which the gate mask 107 is etched using plasma.

Figure 5:
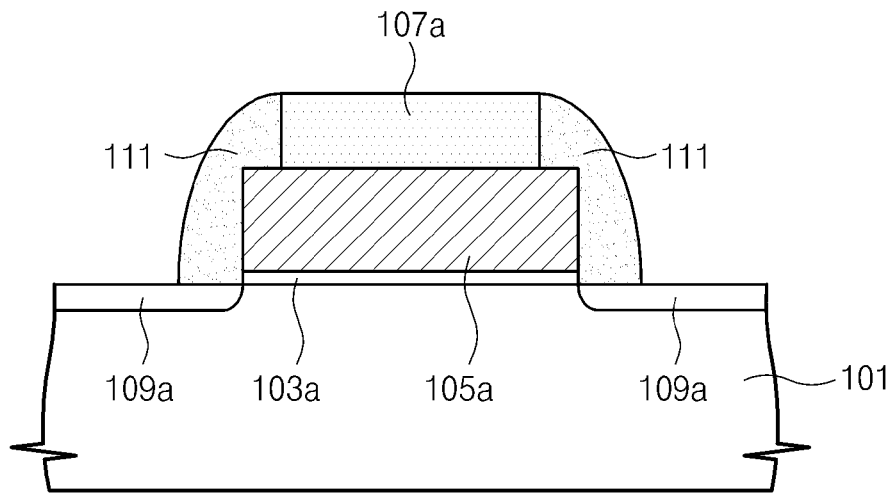

Referring to FIG. 5, an outer spacer 111 is formed by depositing and selectively etching an insulating material (e.g., silicon oxide or silicon nitride) on the substrate 101. The outer spacer 111 covers the part of the upper surface and both sidewalls of the conductive layer pattern 105a and also both sidewalls of the gate mask pattern 107a. Preferably, the outer spacer 111 is formed of a material having an etch selectivity with respect to that of the gate mask pattern 107a. For example, the outer spacer 111 may be formed of silicon oxide when the gate mask pattern 107a is formed of silicon nitride.

Figure 6:
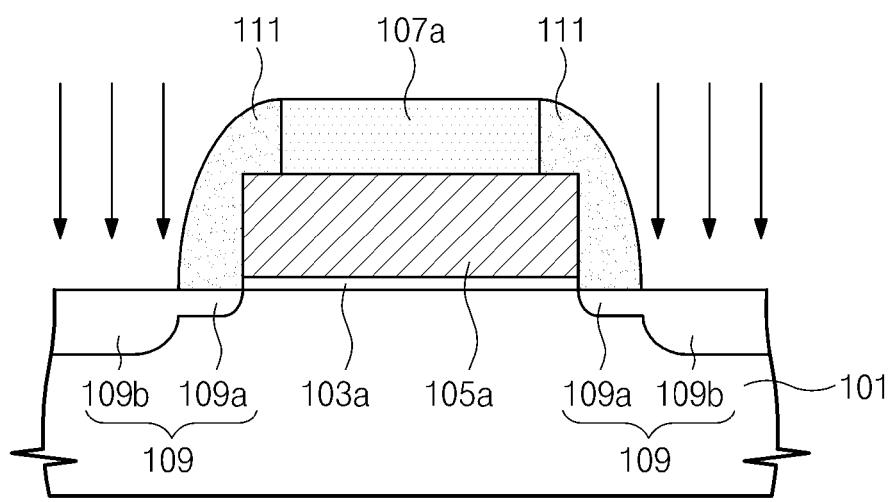

Referring to FIG. 6, the substrate 101 (adjacent to the sides of the outer spacer 111) is doped with an impurity to form a pair of outer source/drain regions 109b. The impurity may be the same as that used for forming the outer source/drain extension region 109a. The outer spacer 111 may be used as a mask during this doping process. Therefore, the outer source/drain regions 109b may be formed in only upper portions of the substrate 101 not covered by the outer spacer 111. Accordingly, the outer source/drain extension regions 109a remain only in upper portions of the substrate below the outer spacer 111. Also, the outer source/drain regions 109b may have a greater depth and a higher concentration of impurities than the outer source/drain extension region 109a. Therefore, a pair of outer junction regions 109 is formed in the substrate 101 at a level below the conductive layer pattern 105a. The outer junction regions 109 may constitute lightly doped drain (LDD) structures each including an outer extension region 109a having a low concentration of impurities and an outer region 109b having a high concentration of impurities.

Figure 7:
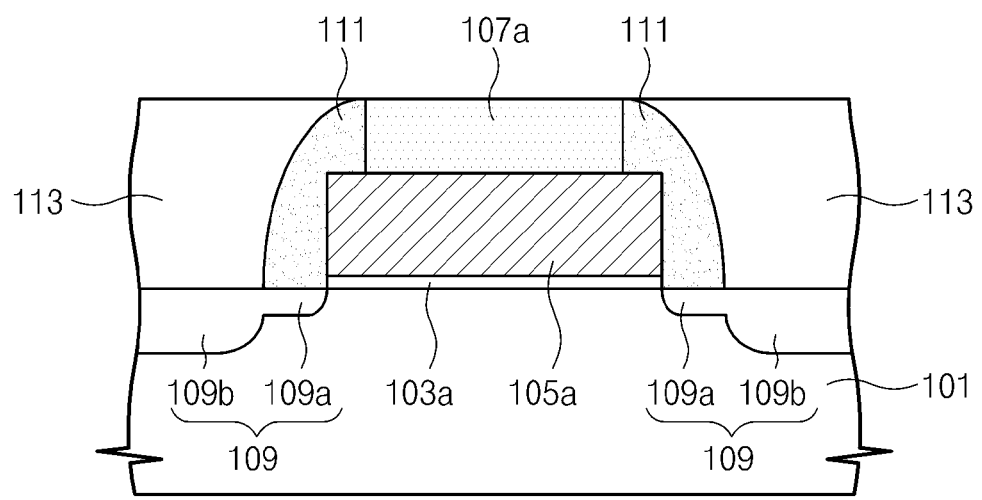

Referring to FIG. 7, an insulation layer 113 is formed on the substrate 101. The insulation layer 113 may be formed by depositing silicon oxide on the substrate 101 until a layer of the silicon oxide covers the gate mask pattern 107a, and planarizing the resulting silicon oxide layer. The planarization process may be terminated once the top of the gate mask pattern 107a is exposed. As a result, the insulation layer 113 is formed on the outer sides of the outer spacer 111.

Figure 8:
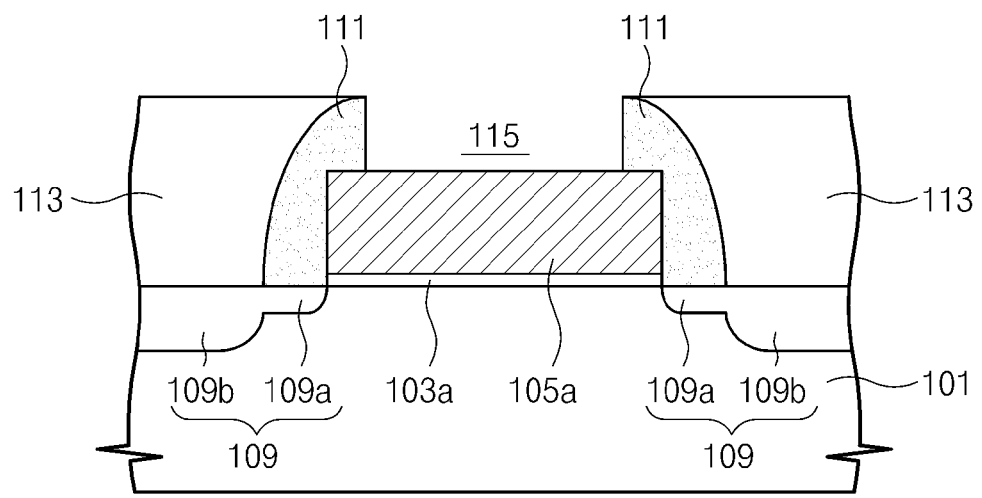

Referring to FIG. 8, the gate mask pattern 107a is etched to form a first opening that exposes the conductive layer pattern 105a. The bottom of the first opening 115 is delimited by the upper surface of the conductive layer pattern 105a and the sides of the first opening 115 are delimited by the inner sides of the outer spacer 111.

Figure 9:
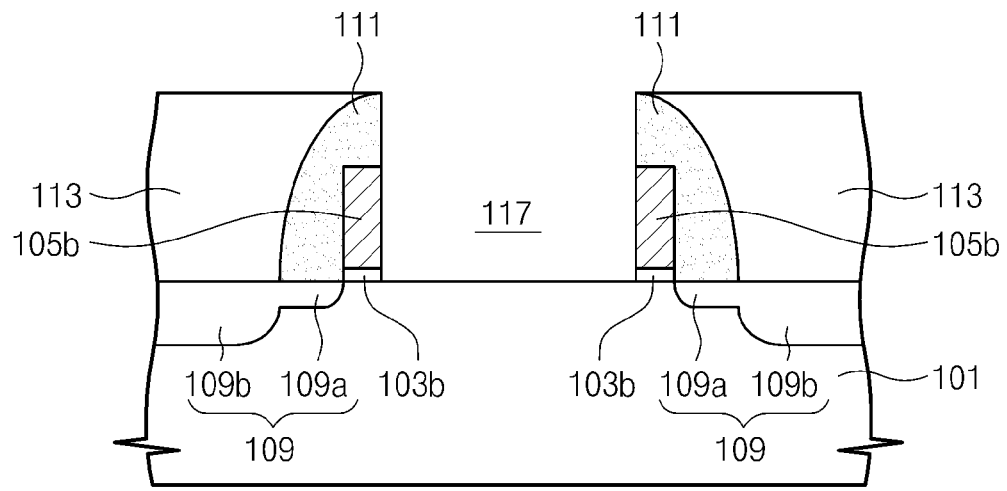

Referring to FIG. 9, a second opening 117 is formed to expose the substrate 101 between the outer spacers 111 by selectively anisotropically etching the conductive layer pattern 105a and the oxide layer pattern 103a. As a result, a pair of gates 105b and a pair of gate oxide layers 103b are formed. The outer spacer 111 covers each gate 105b except at the side of the gate 105b exposed by the second opening 117. That is, outer spacer 111 covers the outer side and top of each gate 105b.

In this part of the process, the pair of gates 105b and the pair of gate oxide layers 103b may be simultaneously formed by selectively etching the conductive layer pattern 105a and the oxide layer pattern 103a at the same time. Alternatively, the pair of gates 105b may be formed first by selectively etching the conductive layer pattern 105a using a first etch process. Then the pair of gate oxide layers 103b is formed by etching away the oxide layer pattern 103a between the gates 105b using a second etch process having an etch recipe different from that of the first etch process used to form the gates 105b.

Figure 10:
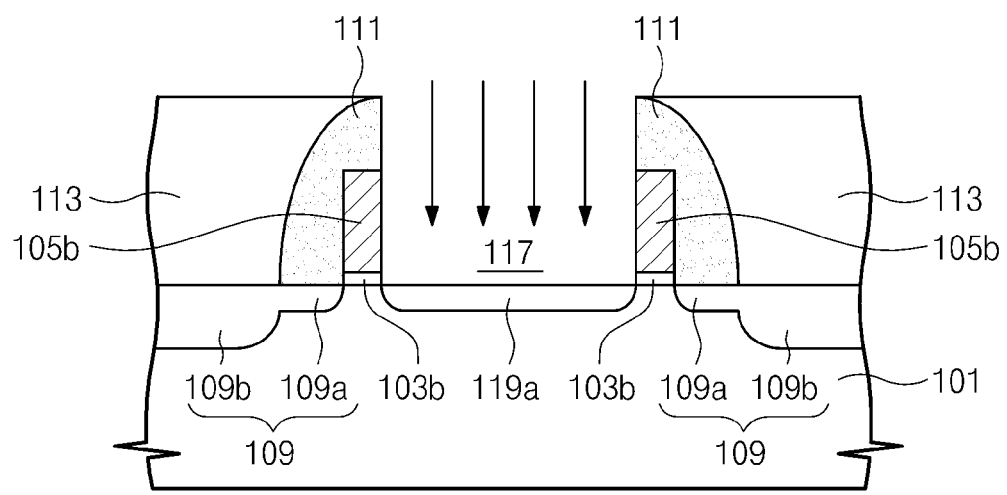

Referring to FIG. 10, an inner source/drain extension region 119a is formed between the pair of gates 105b by doping the substrate 101, at an upper portion thereof exposed by the second opening 117, with an impurity. The impurity used to form the inner source/drain extension region 119a may be the same as the impurity used to form the outer source/drain extension regions 109a. Also, the inner source/drain extension region 119a may have the same concentration of impurities as the outer source/drain extension regions 109a.

Figure 11:
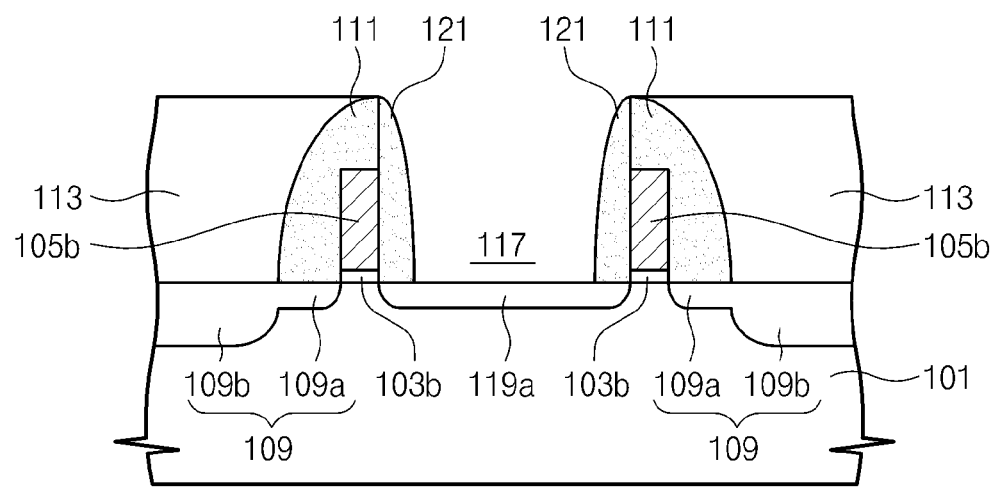

Referring to FIG. 11, an inner spacer 121 is formed over the inner side of each gate 105b exposed by the second opening 117. The inner spacer 121 may be formed of the same material (e.g., silicon oxide or silicon nitride) as the outer spacer 111 and by generally the same method. Also, the inner spacer 121 is thinner than the outer spacer 111. Accordingly, the inner spacer 121 and the outer spacer 111 are asymmetrical with respect to the gate 105b.

Figure 12:
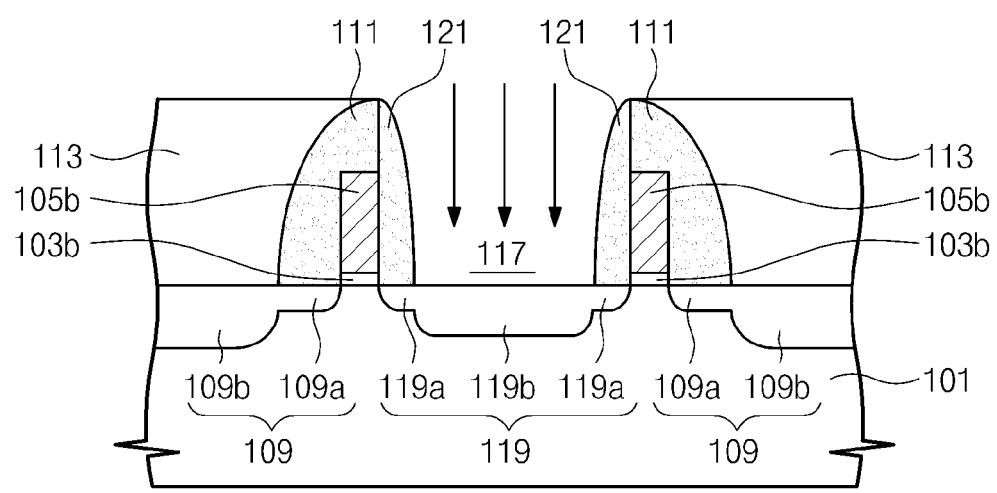

Referring to FIG. 12, an inner source/drain region 119b is formed by doping the substrate, at an upper portion of the substrate which remains exposed by the second opening 117, with an impurity. This impurity may be the same as the impurity used for forming the inner source/drain extension regions 119a. Also, the concentration of the impurity in the inner source/drain region 119b may be similar to that of the outer source/drain region 109b, and the inner source/drain region 119b may be deeper and have a greater concentration of impurities than the inner source/drain extension region 119a. Therefore, an inner junction region 119 is formed in the substrate 101 between the pair of gates 105b. The inner junction region 119 has an LDD structure in which the inner source/drain extension regions 119a, having a relatively low concentration of impurities, are formed at both sides of the inner source/drain region 119b having a higher concentration of impurities. Therefore, the inner junction region 119 can serve as a common source.

The inner spacer 121 is used as a mask during this part of the process, i.e., while the upper portion of the substrate exposed by the opening 107 is being doped. Therefore, the inner source/drain region 119b is limited to the upper portion of the substrate 101 that spans the gates 105b and is not covered by the inner spacer 121. Likewise, the inner source/drain extension region 119a remains only at upper portions of the substrate located below the inner spacer 121. As mentioned above with reference to FIG. 11, the inner spacer 121 and the outer spacer 111 are asymmetrically formed with respect to the gates 105b. Therefore, the inner source/drain extension region 119a is shorter than the outer source/drain extension region 109a. Accordingly, the inner junction region 119 and the outer junction region 109 are asymmetric with respect to each gate 105b with which they are operatively associated.

Figure 13:
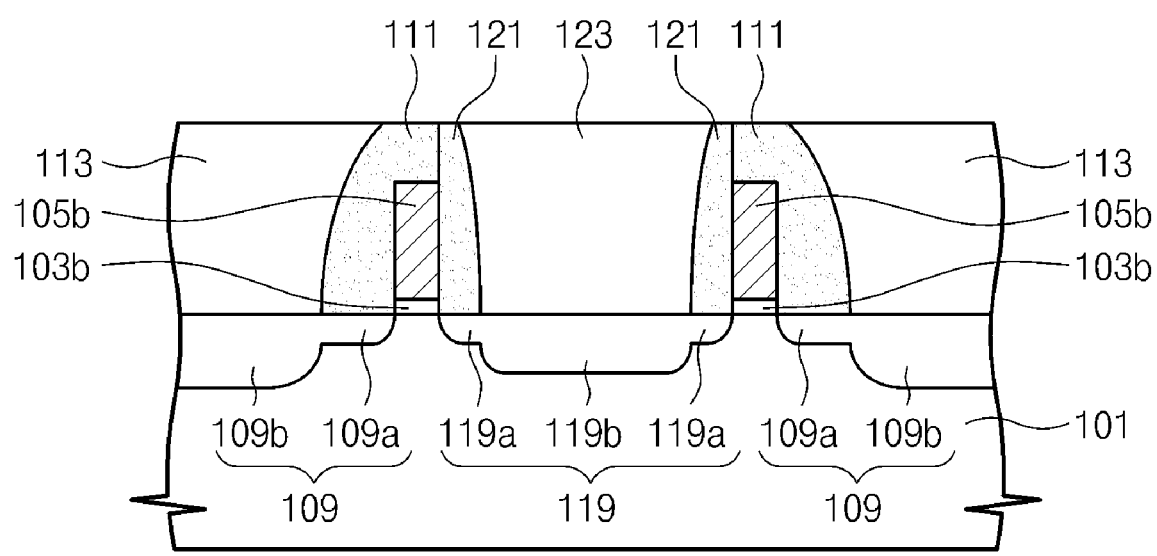

Referring to FIG. 13, an insulation layer 123 is formed to fill the second opening 117. In this respect, the insulation layer 123 may be formed by depositing silicon oxide on the substrate and planarizing the resulting layer of silicon oxide, similar to the forming of the insulation layer 113. Upper portions of the inner and outer spacers 111 and 121 may be removed during the planarization process of forming the insulation layer 123.

According to the present invention as described above, a pullback process is used for forming the gate mask 107. Thus, a semiconductor device 100 having gates 105b which have a width of less than 20 nm may be realized. That is, the present invention facilitates the forming of stable and uniform transistor array having micro-sized gates.

Furthermore, the junction regions 109 and 119 of the semiconductor device are formed so as to be asymmetrical with respect to the gates 105b. In particular, the outer source/drain extension region 109a is longer than the inner source/drain extension region 119a. Thus, the semiconductor device can be improved with respect to short channel effects.

Finally, the junction regions 109 and 119 may have different impurity concentrations. For example, the outer junction region 109 may have a lower concentration of impurities than the inner junction region 119. Therefore, the present invention can reduce the likelihood of punch through.

Therefore, the present invention is particularly advantageous for use in the fabricating of a finFET, and transistors having a multi-channel, an ultra thin body (UTB), a nanowire channel, and a multi-wire channel. Furthermore, the present invention may be applied to the fabricating of DRAM, SRAM, Logic, and non-volatile memory devices.

And, although the present invention has been described in connection with the preferred embodiments thereof, it is to be understood that the scope of the present invention is not so limited. On the contrary, various modifications of and changes to the preferred embodiments will be apparent to those of ordinary skill in the art. Thus, changes to and modifications of the preferred embodiments may fall within the true spirit and scope of the invention as defined by the appended claims.

What is claimed is:

1. A method of fabricating a semiconductor device, comprising:

forming a gate on a substrate, wherein the gate has an upper surface and opposite sidewalls;

forming a spacer which covers the upper surface and sidewalls of the gate and is asymmetric with respect to a plane that extends perpendicular to the substrate intermediate the sidewalls of the gate; and forming first and second junction regions in the substrate below and to both sides of the gate, respectively, such that the first and second junction regions are asymmetric to one another with respect to the plane that extends perpendicular to the substrate intermediate the sidewalls of the gate.

2. A method of fabricating a semiconductor device, comprising:

forming a gate on a substrate, wherein the gate has an upper surface and opposite sidewalls;

forming a spacer which covers the upper surface and sidewalls of the gate and is asymmetric with respect to a plane that extends perpendicular to the substrate intermediate the sidewalls of the gate, wherein forming the spacer comprises: forming a first spacer element, and forming a second spacer element discretely from the first spacer element, such that the first spacer element covers the upper surface and one sidewall of the gate, the second spacer element covers the other sidewall of the gate, and the first and second spacer elements have different thicknesses in a widthwise direction of the gate as measured at the bottom of the gate adjacent the substrate; and forming first and second junction regions in the substrate below and to both sides of the gate, respectively, such that the first and second junction regions are asymmetric to one another with respect to the plane that extends perpendicular to the substrate intermediate the sidewalls of the gate.

3. The method of fabricating a semiconductor device according to claim 2, wherein the forming of the first junction region comprises:

forming a first impurity extension region in the substrate, before the first spacer element is formed, by doping the substrate with an impurity, and forming a first impurity region in the substrate laterally adjacent to the first spacer element by doping the substrate, after the first spacer element has been formed, with the an impurity at a higher concentration than that used to form the first impurity extension region.

4. The method of fabricating a semiconductor device according to claim 3, wherein the forming of the second junction region comprises:

forming a second impurity extension region in the substrate doping the substrate with an impurity before the second spacer element is formed, whereby the first impurity extension region and the second impurity extension region have respective lengths corresponding to the thicknesses of the first and second spacer elements, respectively, such that the second impurity extension region has a different length than the first impurity extension region, and forming a second impurity region in the substrate laterally adjacent to the second spacer element by doping the substrate, after the second spacer element has been formed, with an impurity at a concentration higher than that used to form the second impurity extension region.

5. A method of fabricating a semiconductor device, comprising:

forming a pair of gates on a substrate such that the gates have outer sidewalls which face away from each other and inner sidewalls which face towards each other;

forming an inner junction region in the substrate between the pair of gates;

forming outer junction regions in the substrate laterally outwardly of the pair of gates such that the outer junction regions are adjacent the outer sidewalls of the gates, respectively, and each of the outer junction regions is asymmetric to the inner junction region with respect to a plane that extends perpendicular to the substrate intermediate the sidewalls of the gate which lies between the outer and inner junction regions; and forming outer spacers on the outer sidewalls of the gates, respectively, and forming inner spacers on the inner sidewalls of the gates, respectively, such that the inner and outer spacers formed on each gate are asymmetrical to one another with respect to a plane that extends perpendicular to the substrate intermediate the sidewalls of the gate.

6. The method of fabricating a semiconductor device according to claim 5, wherein the forming of the inner junction region comprises:

forming an inner source/drain region in the substrate between the pair of gates by doping the substrate with an impurity, and forming inner source/drain extension regions in the substrate below the inner spacers adjacent opposite ends of the inner source/drain region, respectively, by doping the substrate with an impurity at a concentration lower than that at which the substrate is doped to form the inner source/drain region.

7. The method of fabricating a semiconductor device according to claim 6, wherein the forming of the outer junction regions comprises:

forming outer source/drain regions in the substrate laterally outwardly of the pair of gates by doping the substrate with an impurity, and forming outer source/drain extension regions in the substrate below the outer spacers adjacent ends of the outer source/drain regions, respectively, by doping the substrate with an impurity at a concentration lower than that at which the substrate is doped to form the outer source/drain regions.

8. The method of fabricating a semiconductor device according to claim 7, wherein the inner and outer spacers are formed on each of the gates so as to have different thicknesses in a widthwise direction of the gate as measured at the bottom of the gate adjacent the substrate, whereby the inner source/drain extension regions have lengths corresponding to the thicknesses of the inner spacers, respectively, and the outer source/drain extension regions have lengths corresponding to the thicknesses of the outer spacers, respectively, such that the length of each of the inner source/drain extension regions is different from the length of the outer source/drain extension region disposed across the gate therefrom.

9. The method of fabricating a semiconductor device according to claim 8, wherein the inner and outer source/drain extension regions are formed such that the length of each of the outer source/drain extension regions is greater than the length of the inner source/drain extension region disposed across the gate therefrom.

10. The method of fabricating a semiconductor device according to claim 5, wherein each of the outer spacers is formed to cover the outer sidewall and upper surfaces of a respective one of the gates, and each of the inner spacers is formed to cover the inner sidewall of a respective one of the gates.

11. A method of fabricating a semiconductor device, comprising:

forming a conductive pattern on a substrate, wherein the conductive pattern has an upper surface and opposite sidewalls;

forming a gate mask pattern which extends over an intermediate part of the conductive pattern and exposes the upper surface of the conductive pattern at opposite sides of the conductive pattern, wherein the gate mask pattern has opposite sidewalls located laterally inwardly of the sidewalls of the conductive pattern, respectively;

forming outer spacers each of which covers a respective one of the sidewalls and an exposed portion of the upper surface of the conductive pattern as well as a respective one of the sidewalls of the gate mask pattern;

subsequently selectively removing the gate mask pattern to expose the intermediate portion of the conductive pattern, and etching the conductive pattern to thereby form a pair of gates from the conductive pattern, wherein each of the gates has an inner sidewall that is exposed, and an outer sidewall and an upper surface both covered by a respective one of the outer spacers; and doping the substrate to form an inner junction region in the substrate between the pair of gates, and outer junction regions located in the substrate on opposite sides of a region of the substrate over which the conductive pattern is formed, such that the outer junction regions are located in the substrate laterally outwardly of the pair of gates.

12. The method of fabricating a semiconductor device according to claim 11, wherein the forming of the conductive pattern and the gate mask pattern comprises:
forming a conductive layer on the substrate,
subsequently forming a gate mask on the conductive layer,
etching the conductive layer using the gate mask as an etching mask to thereby form the conductive pattern, and
subsequently pulling back the gate mask from the opposite sides of the conductive pattern by etching the gate mask after the conductive layer pattern has been formed.

13. The method of fabricating a semiconductor device according to claim 11, wherein the forming of the outer junction regions comprises:
doping the substrate adjacent to sidewalls of the conductive pattern with an impurity before the outer spacers are formed to thereby form outer impurity extension regions, and
after the outer spacers have been formed and before the gate mask is removed, doping the substrate with an impurity at a concentration higher than that used to form the outer impurity extension regions.

14. The method of fabricating a semiconductor device according to claim 11, further comprising:
forming inner spacers which cover the inner sidewalls of the gates, respectively.

15. The method of fabricating a semiconductor device according to claim 14, wherein the forming of the inner junction region comprises:
doping the substrate between the gates with an impurity to thereby form an inner impurity extension region, and
after the inner spacers have been formed, doping the substrate between the inner spacers with an impurity at a concentration higher than that used to form the inner impurity extension region.

16. The method of fabricating a semiconductor device according to claim 14, wherein the inner and outer spacers are formed on each of the gates so as to have different thicknesses in a widthwise direction of the gate as measured at the bottom of the gate adjacent the substrate.

17. The method of fabricating a semiconductor device according to claim 14, wherein the forming of the outer junction regions comprises doping the substrate adjacent to sidewalls of the conductive pattern with an impurity before the outer spacers are formed to thereby form outer impurity extension regions, and
after the outer spacers have been formed and before the gate mask is removed, doping the substrate with an impurity at a concentration higher than that used to form the outer impurity extension regions; and
the forming of the inner junction region comprises doping the substrate between the gates with an impurity to thereby form an inner impurity extension region, and
after the inner spacers have been formed, doping the substrate between the inner spacers with an impurity at a concentration higher than that used to form the inner impurity extension region.

18. The method of fabricating a semiconductor device according to claim 17, wherein the inner and outer spacers are formed on each of the gates so as to have different thicknesses in a widthwise direction of the gate as measured at the bottom of the gate adjacent the substrate.

19. The method of fabricating a semiconductor device according to claim 11, wherein the forming of the outer spacers comprises depositing insulating material on the substrate having an etch selectivity with respect to the material of the gate mask to thereby form a layer of the insulating material, and etching the layer of insulating material.

20. The method of fabricating a semiconductor device according to claim 11, further comprising:
after the outer junction regions have been formed, forming a first insulation layer on the substrate which exposes the gate mask pattern; and
after the inner junction region has been formed, forming a second insulation layer on the substrate between the inner spacers.

* * * * *